United States Patent
Wang et al.

(10) Patent No.: US 11,290,808 B2
(45) Date of Patent: Mar. 29, 2022

(54) HORN MOUNTING STRUCTURE AND ELECTRONIC DEVICE HAVING SAME

(71) Applicant: MOBVOI INFORMATION TECHNOLOGY COMPANY LIMITED, Beijing (CN)

(72) Inventors: Baolin Wang, Beijing (CN); Jianguo Li, Beijing (CN)

(73) Assignee: MOBVOI INFORMATION TECHNOLOGY COMPANY LIMITED

(*) Notice: Subject to any disclaimer, the term of this patent is extended or adjusted under 35 U.S.C. 154(b) by 825 days.

(21) Appl. No.: 15/778,981

(22) PCT Filed: May 18, 2018

(86) PCT No.: PCT/CN2018/087467
§ 371 (c)(1),
(2) Date: May 24, 2018

(87) PCT Pub. No.: WO2019/144539
PCT Pub. Date: Aug. 1, 2019

(65) Prior Publication Data
US 2021/0266660 A1     Aug. 26, 2021

(30) Foreign Application Priority Data
Jan. 24, 2018 (CN) .......................... 201810069346.5

(51) Int. Cl.
*H04R 1/30* (2006.01)
*H04R 1/02* (2006.01)
(Continued)

(52) U.S. Cl.
CPC ............... *H04R 1/30* (2013.01); *H04R 1/023* (2013.01); *H04R 1/028* (2013.01); *H05K 5/0086* (2013.01);
(Continued)

(58) Field of Classification Search
CPC .......... H04R 1/02; H04R 1/023; H04R 1/028; H04R 1/30; H04R 2201/02;
(Continued)

(56) References Cited

U.S. PATENT DOCUMENTS

2007/0223744 A1* 9/2007 Wada ................... H04R 23/008
381/152

FOREIGN PATENT DOCUMENTS

| CN | 202085292 U | 12/2011 |
| CN | 202931405 U | 5/2013 |

(Continued)

OTHER PUBLICATIONS

International Search Report dated Sep. 29, 2018; International Patent Application No. PCT/CN2018/087467.

*Primary Examiner* — Mark Fischer
(74) *Attorney, Agent, or Firm* — McDonald Hopkins LLC (57) ABSTRACT

A horn mounting structure, includes: a shell, a sound hole is formed at a side surface of the shell; a mounting groove formed inside the shell, and the sound hole is communicated with the mounting groove; a holder, the holder is bonded in the mounting groove through a sealant, and a front sound chamber is formed at one side of the holder facing to the sound hole, and a horn, and the horn is bonded to one side of the holder facing away from the shell through the sealant.

19 Claims, 6 Drawing Sheets

(51) Int. Cl.
*H05K 5/00* (2006.01)
*H05K 5/02* (2006.01)

(52) U.S. Cl.
CPC ........ *H05K 5/0217* (2013.01); *H04R 2400/11* (2013.01); *H04R 2499/11* (2013.01)

(58) Field of Classification Search
CPC ............ H04R 2400/11; H04R 2499/11; H05K 5/0086; H05K 5/0217
See application file for complete search history.

(56) References Cited

FOREIGN PATENT DOCUMENTS

| | | |
|---|---|---|
| CN | 203590383 U | 5/2014 |
| CN | 106101947 A | 11/2016 |
| CN | 106686506 A | 5/2017 |
| CN | 206341406 U | 7/2017 |
| CN | 107528944 A | 12/2017 |
| JP | 2001197182 A | 7/2001 |

\* cited by examiner

HORN MOUNTING STRUCTURE AND ELECTRONIC DEVICE HAVING SAME

CROSS-REFERENCE TO RELATED APPLICATION

This application is a 35 U.S.C. 371 national stage filing of PCT Application No. PCT/CN2018/087467 filed on May 18, 2018, which claims priority to Chinese Patent Application No. 201810069346.5 filed on Jan. 24, 2018.

TECHNICAL FIELD

The present disclosure relates to the technical field of electronic devices, and for example to a horn mounting structure and an electronic device having same.

BACKGROUND

In a small electronic device, such as a watch or a wristband, in order to facilitate sounding of a horn and saving space occupation of a horn, a sound hole of the device is usually formed at a side surface of a metal shell. When the horn and the metal shell are assembled, the following two solutions are usually adopted in a related art.

Relative Technical Solution I:

Firstly, the metal shell is placed in a mold; then, an internal assembly structure is molded in the metal shell by a nano injection molding process; and later, the horn is mounted in the internal assembly structure. However, for the electronic device prepared with such process, an injection molding material and a metal material have poor physical associativity, causing that the junction between the internal assembly structure and the metal shell has poor waterproof reliability, and more defective products with water leakage would be presented during mass production.

Relative Technical Solution II:

The internal assembly structure is processed on the metal shell directly using a Computer numerical control (CNC) processing technology, and then, the horn is mounted in the internal assembly structure. However, it may increase the processing difficulty of the metal shell and greatly increase the processing cost of the metal shell that an internal structure for assembling the horn is directly processed on the metal shell. Meanwhile, for small products having tiny structures, such as the watch or the wristband, it would also be very difficult when a dustproof net or other structures are added in a subsequent procedure by virtue of such form of shell.

SUMMARY

Based on the above mentioned, the present disclosure provides a horn mounting structure and an electronic device having same, which may effectively improve the waterproof reliability of the electronic device, reduce the processing and assembly difficulties of the horn mounting structure and save production cost.

A horn mounting structure includes: a shell; a holder, where a sound hole formed at a side surface of the shell; a mounting groove formed inside the shell; where the sound hole is communicated with the mounting groove, and the holder is bonded in the mounting groove through a sealant; a front sound chamber formed at one side of the holder facing to the sound hole; and a horn bonded to one side of the holder facing away from the shell through the sealant.

In an embodiment, a dustproof net is further included, and the dustproof is arranged between the sound hole and the front sound chamber and is bonded with the shell and the holder respectively.

In an embodiment, the dustproof net includes a first connecting portion, a dustproof portion and a second connecting portion which are successively connected; the first connecting portion is arranged between an inside bottom of the mounting groove and a top of the holder, the dustproof portion is arranged at the sound hole, and the second connecting portion is arranged between a side surface of the mounting grove and a side surface of the holder.

In an embodiment, the inside bottom of mounting groove is bonded with the first connecting portion through a first bonding layer.

In an embodiment, a first connecting surface is formed at the top of the holder, and the first connecting portion and the second connecting portion of the dustproof net are bonded with the first connecting surface through a second bonding layer.

In an embodiment, a periphery of a side wall of the holder is bonded with the mounting groove through a third bonding layer.

In an embodiment, the holder comprises a groove, and the groove is configured for mounting the horn; a second connecting surface is formed in the groove, a third connecting surface is formed at a first part of the horn, and the second connecting surface is bonded with the third connecting surface through a fourth bonding layer.

In an embodiment, the third bonding layer and the fourth bonding layer are sealant layers.

In an embodiment, at least one of the first bonding layer and the second bonding layer is a sealant layer.

An electronic device includes the horn mounting structure in any solution above.

In an embodiment, the electronic device is an electronic watch, a sports bracelet, a mobile phone or a tablet computer.

An embodiment ensures the sealing connection between the holder and the shell and between the horn and the holder on the basis of achieving a side sounding function of the shell, thereby effectively improving waterproof reliability of the electronic device, and solving problems that a plastic material and the metal material have poor bonding reliability in the existing horn mounting structure and the water leakage is easily generated at a joint; and meanwhile, the shell, the holder and other structures of the present disclosure could be separately produced and then assembled, thereby reducing the processing and assembly difficulties of the horn mounting structure, reducing the production cost, and solving the problems of complicated processing of the metal shell and high cost caused by direct processing of the horn mounting structure on the shell in the existing art. In addition, the horn mounting structure of the present disclosure, as an independent assembly module, avoids a matching relationship with other structures having a waterproof demand in the shell, thereby reducing the complexity of a waterproof structure of the shell, and improving waterproof capability and production convenience of the shell.

In the figures:
1-Shell; 11-Sound hole; 12-Mounting groove;
2-Dustproof net; 21-First connecting portion; 22-Dustproof portion; 23-Second connecting portion;
3-Holder; 31-First connecting surface; 32-Division plate; 33-Front sound chamber; 34-Reinforcing rib; 35-Through hole; 36-Groove;
4-Horn; 41-Third connecting surface;
5-First bonding layer; 6-Second bonding layer; 7-Third bonding layer; and 8-Fourth bonding layer.

DETAILED DESCRIPTION

The "top" in the prevent disclosure refers to one side close to an outer part of the shell in a corresponding component, and the "bottom" refers to one side close to an inner part of the shell in the corresponding component.

Figure 1:
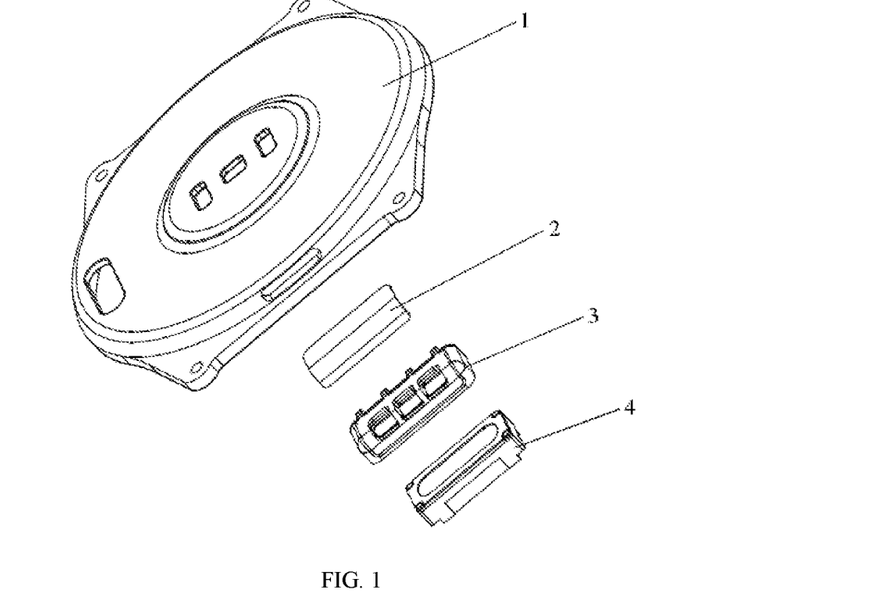
FIG. 1 is an exploded diagram illustrating a horn mounting structure provided by an embodiment (a bonding layer is not shown)
Figure 3:
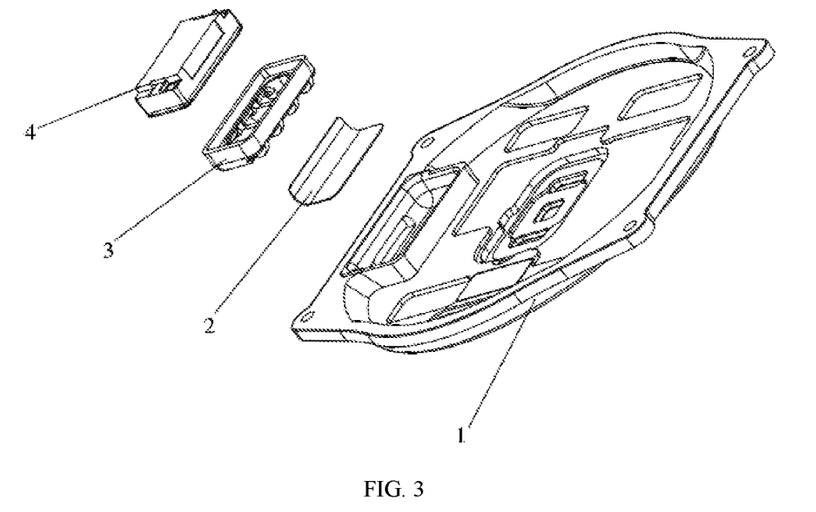
FIG. 3 is a schematic diagram of FIG. 1 from another angle.
Figure 5:
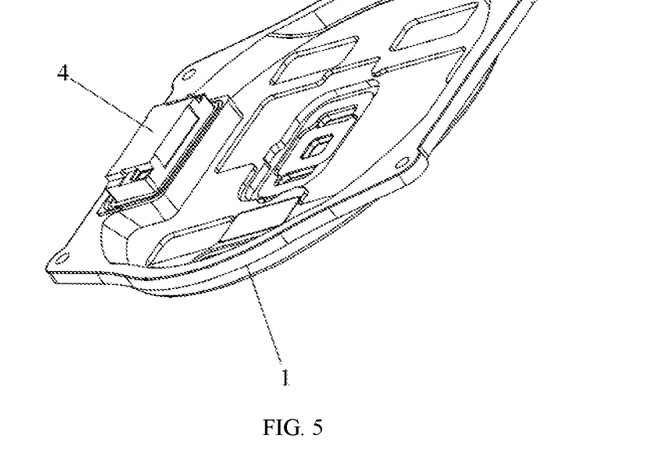
FIG. 5 is an assembly diagram illustrating a horn mounting structure provided by another embodiment.
Figure 7:
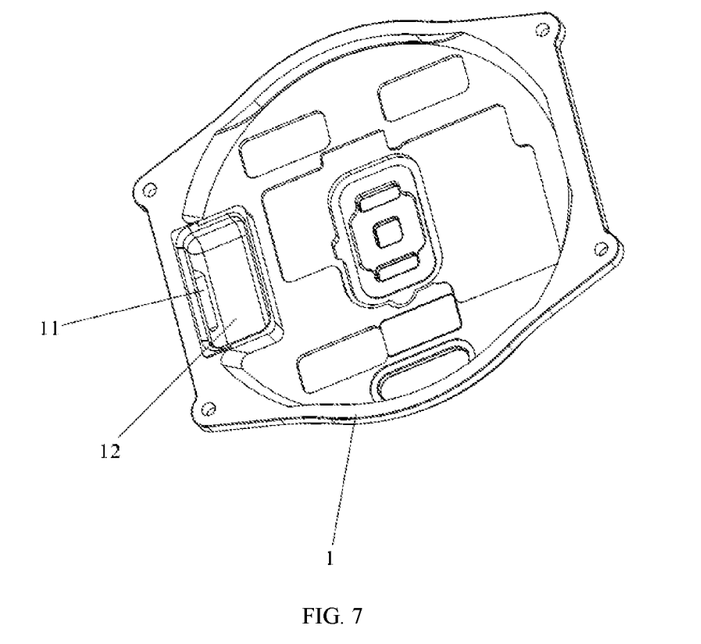
FIG. 7 is a structural diagram illustrating a shell involved in an embodiment.
Figure 8:
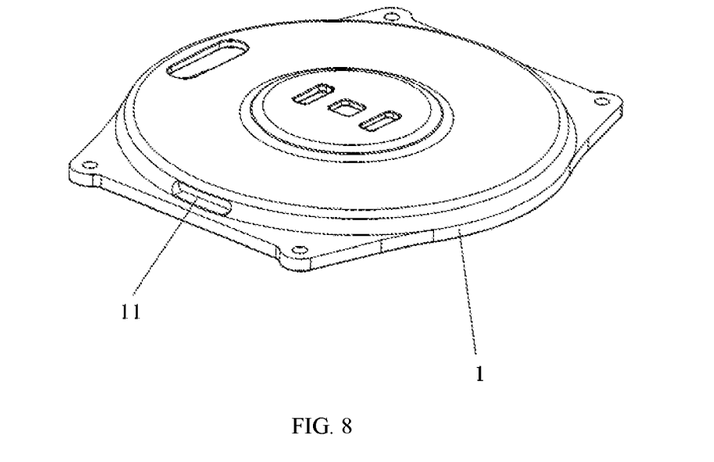
FIG. 8 is schematic diagram of FIG. 7 from another angle.

As shown in FIG. 1, FIG. 3 and FIG. 5, the present embodiment provides a horn mounting structure for an electronic device, including a shell 1, a holder 3 and a horn 4, the shell 1 (see FIG. 7 and FIG. 8) is a metal shell processed through CNC; a sound hole 11 is formed at a side surface of the shell 1 for achieving a side sounding function of the electronic device, to avoid influencing an appearance and a sounding effect of the electronic device when the sound hole 11 is formed in an upper surface or a lower surface of the shell 1. A mounting groove 12 is formed at a position in an inner part of the shell 1 that is close to a side surface of the shell 1; and the sound hole 11 is communicated with the mounting groove 12, so as to transmit the sound made by the horn 4 arranged in the mounting groove 12 to an outer part of the electronic device. The holder 3 is mounted in the mounting groove 12, and an outline dimension of the holder 3 is matched with that of the mounting groove 12, so as to increase the mounting stability of the holder 3 and the structural compactness of the shell 1. Optionally, the holder 3 is bonded in the mounting groove 12 through a sealant. The sealant is adopted for connection, thereby not only guaranteeing the fixing reliability between the holder 3 and the shell 1, but also greatly improving the leakproofness of a junction between the holder 3 and the shell 1 and preventing water leakage. In addition, a front sound chamber 33 is formed at one side of the holder 3 (see FIG. 9 and FIG. 10), which faces to the sound hole 11 and enables that the sound hole 11 is communicated with the horn 4, so as to achieve the side sounding function of the electronic device. The horn 4 is mounted in the holder 3, and in an embodiment, the horn 4 is bonded at one side of the holder 3 facing to the inside of the shell 1 through the sealant. Such connection manner also guarantees the fixing reliability between the horn 4 and the holder 3, and effectively improves the sealing effect between the horn 4 and the holder 3. Herein, the sealant used in the present embodiment is curable liquid glue, so as to achieve the sealing and fixing effects. Compared with a waterproof double-sided adhesive tape and a waterproof cotton adhesive tape, the horn mounting structure in the present embodiment could achieve higher waterproof level and more durable waterproof effect. Meanwhile, the horn mounting structure also has better weather fastness and corrosion resistance. Through tests, the horn mounting structure of the present embodiment has waterproofness above IPX8.

In the present embodiment, through the sealant, the holder 3 is bonded in the mounting groove 12 of the shell 1, and the horn 4 is bonded on the holder 4, thereby guaranteeing the sealing connection between the holder 3 and the shell 1 and between the horn 4 and the holder 3 on the basis of achieving the side sounding function of the shell 1, effectively improving the waterproof reliability of the electronic device, and solving the problems that a plastic material and the metal material have poor bonding reliability in the horn mounting structure and the water leakage is easily generated at a joint in the related art. Meanwhile, the shell 1, the holder 3 and other structures of the present embodiment could be separately produced and then assembled, thereby reducing the processing and assembly difficulties of the horn mounting structure, reducing the production cost, and solving the problems of complicated processing of the metal shell and high cost caused by direct processing of the horn mounting structure on the shell 1 in the existing art. In addition, the horn mounting structure of the present embodiment, as an independent assembly module, avoids a matching relationship with other structures having a waterproof demand in the shell 1, thereby reducing the complexity of a waterproof structure of the shell 1, and improving the waterproof ability and production convenience of the shell 1.

Figure 2:
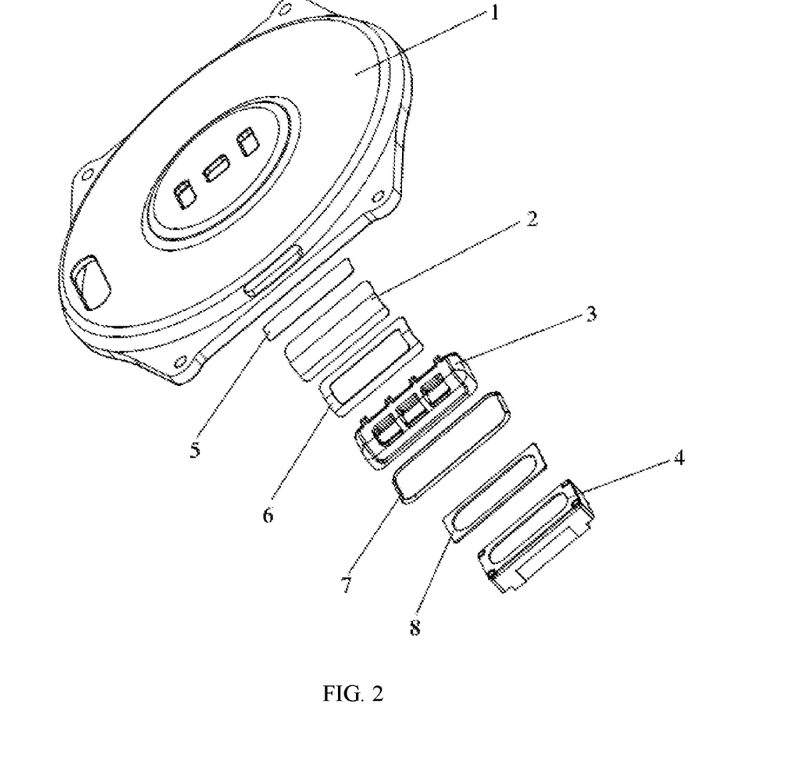
FIG. 2 is a exploded diagram illustrating a horn mounting structure provided by another embodiment (a bonding layer is shown)
Figure 4:
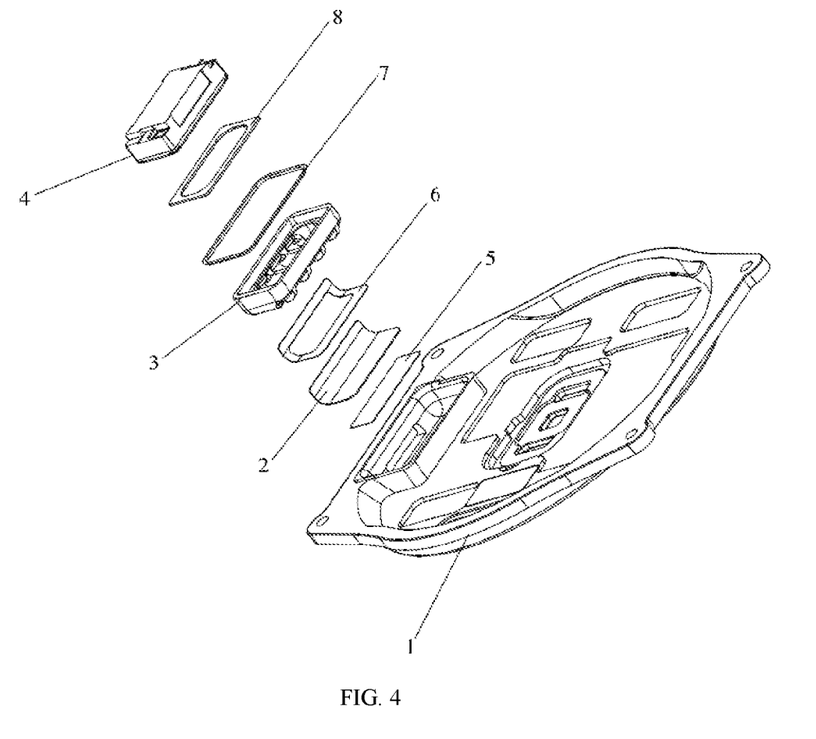
FIG. 4 is a schematic diagram of FIG. 2 from another angle.
Figure 6:
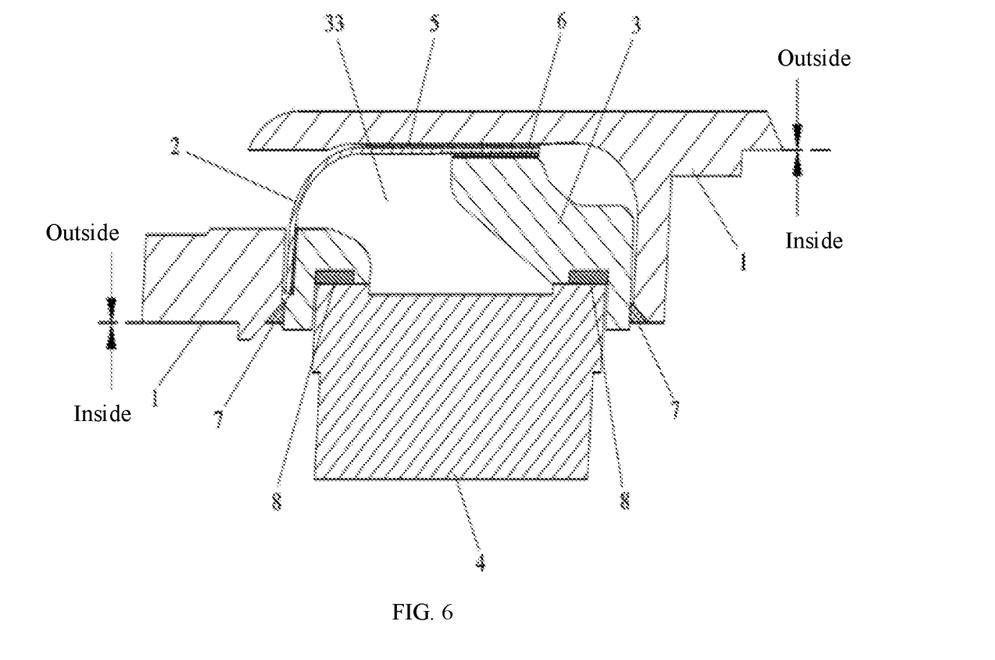
FIG. 6 is a partial section view illustrating a horn mounting structure provided by an embodiment.
Figure 12:
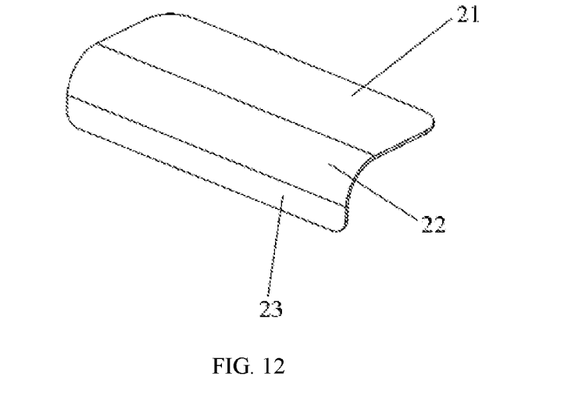
FIG. 12 is a structural diagram illustrating a dustproof net involved in an embodiment.

Further, as shown in FIG. 6, a dustproof net 2 is further arranged between the sound hole 11 and the front sound chamber 33, for preventing impurities such as dust from entering into the front sound chamber 33, thereby preventing the dust from influencing normal work of the horn 4. In one embodiment, the dustproof net 2 is connected with the shell 1 and the holder 3 respectively by a gluing way, thereby simplifying the mounting process of the dustproof net 2 and increasing the assembly efficiency of the shell 1. In one embodiment, as shown in FIG. 12, the dustproof net 2 has a bending shape, and includes a first connecting portion 21, a dustproof portion 22 and a second connecting portion 23 which are successively connected, the first connecting portion 21 is arranged between a bottom of the mounting groove 12 and a top 37 of the holder 3, the dustproof portion 22 is arranged at the sound hole 11, and the second connecting portion 23 is arranged between a side surface of the mounting grove 12 and a side surface of the holder 3. As shown in FIG. 2 and FIG. 4, one side of dustproof net 2, for instance, one side of the first connecting portion 21 is bonded with a bottom of the mounting groove 12 through a first bonding layer 5, and a shape of the cured first bonding layer 5 is a rectangle; the edge of the second side of the dustproof net 2 is bonded with the holder 3 through a second bonding layer 6, and a bonding position of dustproof net 2 includes edges of the first connecting portion 21, the dustproof portion 22 and the second connecting portion 23.

In an embodiment, a circle of first connecting surface 31 (see FIG. 9) is formed around the front sound chamber 33 at the top 37 of the holder 3, the dustproof net 2 is bonded with the first connecting surface 31 through the second bonding layer 6, and a shape of the cured second bonding layer 6 is the same as that of the first connecting surface 31, so as to achieve firm connection between the holder 3 and the dustproof net 2, and prevent a gluing layer from influencing the sounding of the horn 4. In an embodiment, the first connecting portion 21 and the dustproof portion 22 may connected to each other through the second bonding layer 6.

In the present embodiment, the dustproof net 2 could be made of materials having dustproof and ventilation functions, such as cloth materials; and the dustproof net 2 could be bonded with the shell 1 and the holder 3 by gluing when mounting; a two-sided glue could also be arranged at both sides of the dustproof net 2, and when mounting, the dustproof net 2 is directly connected with the shell 1 and the holder 3 by removing the two-sided glue, and such mounting process is more simple and fast, thereby greatly increasing the assembly efficiency of the shell 1.

Figure 9:
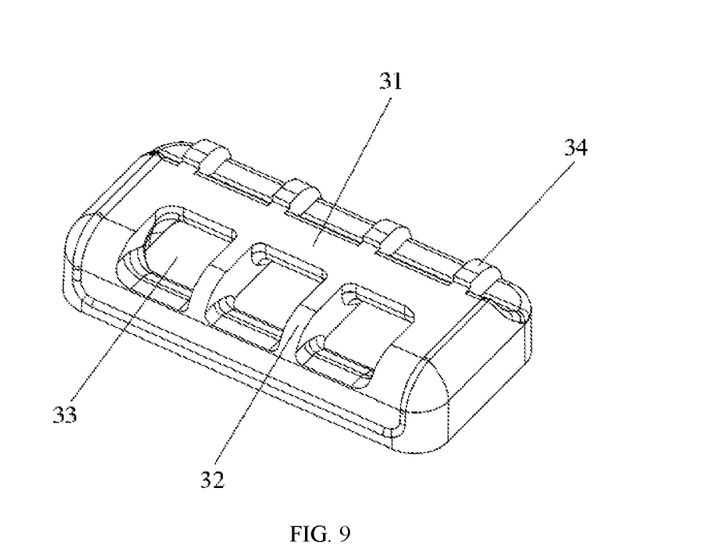
FIG. 9 is a structural diagram illustrating a holder involved in an embodiment.

Further, as shown in FIG. 9, a plurality of division plates 32 are also arranged at the top 37 of the holder 3. Each of the division plates 32 divides an internal space of the holder 3 into a plurality of front sound chambers 33, which are communicated with each other. Through such arrangement, the structural strength of the holder 3 is increased, and meanwhile, a certain supporting role can be played for the dustproof net 2, thereby preventing the deformation of the dustproof net 2. In addition, to facilitate the processing and save manufacturing cost, the holder 3 of the present embodiment is preferably formed integrally by plastic materials. Meanwhile, reinforcing ribs 34 are further arranged at the top of the holder 3, to achieve the effect of improving the structural strength of the holder 3, improving the processing technology of the holder 3 and preventing shrinkage and other defects.

Figure 10:
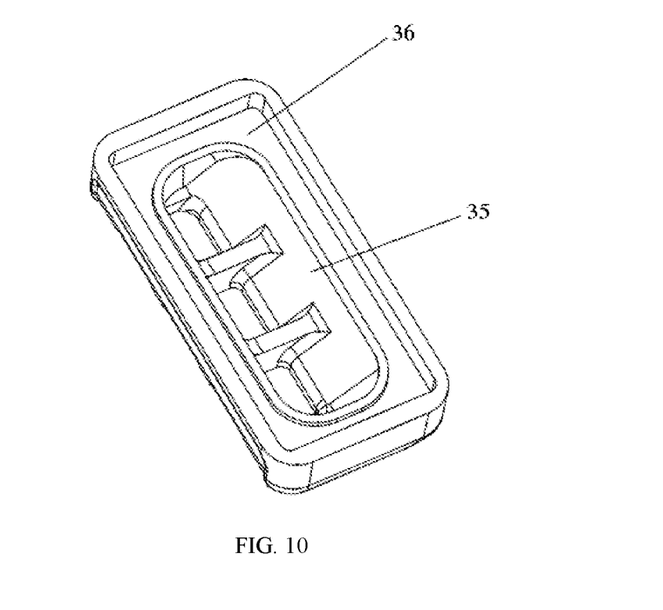
FIG. 10 is schematic diagram of FIG. 9 from another angle.
Figure 11:
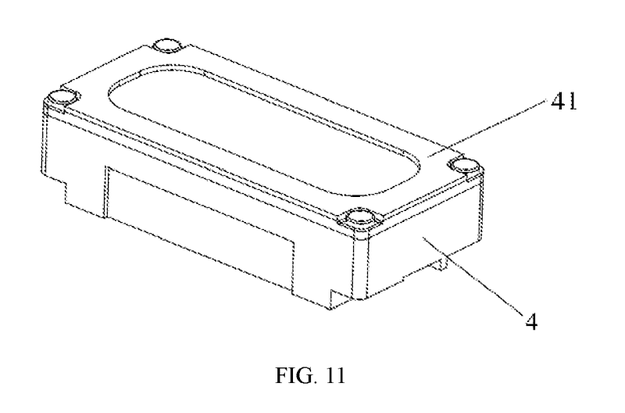
FIG. 11 is a structural diagram illustrating a horn involved in an embodiment.

In the present embodiment, an outer side of the side wall of the holder 3 is bonded with an inner side of the mounting groove 12 through a third bonding layer 7, and the third bonding layer 7 is a sealant layer, so as to guarantee the sealing performance between the holder 3 and the mounting groove 12, and prevent water leakage at the junction of the holder 3 and the mounting groove 12. As shown in FIG. 10, an oblong through hole 35 is further formed at the bottom of the holder 3, for communicating the front sound chambers 33 with the horn 4; and a circle of annular groove 36 is formed along a periphery of the through hole 35, for mounting the horn 4. In one embodiment, a second connecting surface is formed in the groove 36, a third connecting surface 41 is formed at the top of the horn 4 (see FIG. 11), the second connecting surface is bonded with the third connecting surface 41 through a fourth bonding layer 8, and herein, the fourth bonding layer 8 is also a sealant layer, to achieve the waterproof sealing between the holder 3 and the horn 4. Through the above arrangement, as shown in FIG. 6, the horn mounting structure of the present embodiment takes a dash line in the figure as a boundary; a region above the dash line is communicated with the outer part of the shell 1 and is a non-waterproof region; and a region below the dash line is communicated with the inner part of the shell 1 and is a waterproof region, thereby effectively preventing water from entering into the shell from the sound hole 11, and guaranteeing safe operation of internal components of the electronic device. The first bonding layer 5 and the second bonding layer 6 in the present embodiment could also be the sealant layers, so as to further increase the waterproof capability of the horn mounting structure.

The present embodiment further provides an electronic device, including the above horn mounting structure. In an embodiment, the electronic device is an electronic watch, a sports bracelet, a mobile phone or a tablet computer. The present embodiment guarantees the sealing connection between the shell and the horn and effectively improving the waterproof reliability of the electronic device, on the basis of achieving the side sounding function of the shell. Meanwhile, when the horn is mounted, a common standard horn could be selected to achieve the waterproof function of the whole machine, without specially customizing a horn having a special structure, thereby simplifying the manufacturing process of the electronic device, reducing the processing and assembly difficulties of the horn mounting structure and saving the production cost.

INDUSTRIAL APPLICABILITY

A horn mounting structure provided by the present application ensures the sealing connection between the holder and the shell and between the horn and the holder on the basis of achieving a side sounding function of the shell, thereby effectively improving waterproof reliability of the electronic device, and solving problems that a plastic material and the metal material have poor bonding reliability in the existing horn mounting structure and the water leakage is easily generated at a joint.

What is claimed is:

1. A horn mounting structure, comprising:
   a shell, wherein a sound hole is formed at a side surface of the shell;
   a mounting groove formed inside the shell, wherein the sound hole is communicated with the mounting groove;
   a holder, wherein the holder is bonded in the mounting groove through a sealant, and a front sound chamber is formed at one side of the holder facing to the sound hole, and
   a horn, wherein the horn is bonded to one side of the holder facing away from the shell through the sealant.

2. The horn mounting structure according to claim 1, further comprising a dustproof net;
   wherein the dustproof net is arranged between the sound hole and the front sound chamber, and is bonded with the shell and the holder respectively.

3. The horn mounting structure according to claim 2, wherein the dustproof net comprises a first connecting portion, a dustproof portion and a second connecting portion which are successively connected;
   wherein the first connecting portion is arranged between an inside bottom of the mounting groove and a top of the holder, the dustproof portion is arranged at the sound hole, and the second connecting portion is arranged between a side surface of the mounting groove and a side surface of the holder.

4. The horn mounting structure according to claim 3, wherein the inside bottom of mounting groove is bonded with the first connecting portion through a first bonding layer.

5. The horn mounting structure according to claim 4, wherein a first connecting surface is formed at the top of the holder, and the first connecting portion and the second connecting portion of the dustproof net are bonded with the first connecting surface through a second bonding layer.

6. The horn mounting structure according to claim 5, wherein a periphery of a side wall of the holder is bonded with the mounting groove through a third bonding layer.

7. The horn mounting structure according to claim 6, wherein the holder comprises a groove, and the groove is configured for mounting the horn; a second connecting surface is formed in the groove, a third connecting surface is formed at a first part of the horn, and the second connecting surface is bonded with the third connecting surface through a fourth bonding layer.

8. The horn mounting structure according to claim 7, wherein the third bonding layer and the fourth bonding layer are sealant layers.

9. The horn mounting structure according to claim 5, wherein at least one of the first bonding layer and the second bonding layer is a sealant layer.

10. An electronic device, comprising:
a horn mounting structure, wherein the horn mounting structure comprises:
a shell, wherein a sound hole is formed at a side surface of the shell;
a mounting groove formed inside the shell, wherein the sound hole is communicated with the mounting groove;
a holder, wherein the holder is bonded in the mounting groove through a sealant, a front sound chamber is formed at one side of the holder facing to the sound hole, and
a horn, wherein the horn is bonded to one side of the holder facing away from the shell through the sealant.

11. The electronic device according to claim 10, comprising an electronic watch, a sports bracelet, a mobile phone or a tablet computer.

12. The electronic device according to claim 10, wherein the horn mounting structure comprises a dustproof net;
wherein the dustproof net is arranged between the sound hole and the front sound chamber and is bonded with the shell and the holder respectively.

13. The electronic device according to claim 10, wherein the dustproof net comprises a first connecting portion, a dustproof portion and a second connecting portion which are successively connected;
wherein the first connecting portion is arranged between an inside bottom of the mounting groove and a top of the holder, the dustproof portion is arranged at the sound hole, and the second connecting portion is arranged between a side surface of the mounting groove and a side surface of the holder.

14. The electronic device according to claim 10, wherein the inside bottom of mounting groove is bonded with the first connecting portion through a first bonding layer.

15. The electronic device according to claim 10, wherein a first connecting surface is formed at the top of the holder, and the first connecting portion and the second connecting portion of the dustproof net are bonded with the first connecting surface through a second bonding layer.

16. The electronic device according to claim 10, wherein a periphery of a side wall of the holder is bonded with the mounting groove through a third bonding layer.

17. The electronic device according to claim 10, wherein the holder comprises a groove, and the groove is configured for mounting the horn; a second connecting surface is formed in the groove, a third connecting surface is formed at a first part of the horn, and the second connecting surface is bonded with the third connecting surface through a fourth bonding layer.

18. The electronic device according to claim 10, wherein the third bonding layer and the fourth bonding layer are sealant layers.

19. The electronic device according to claim 10, wherein at least one of the first bonding layer and the second bonding layer is a sealant layer.

* * * * *